United States Patent [19]
Donohoe et al.

[11] Patent Number: 6,074,957
[45] Date of Patent: Jun. 13, 2000

[54] METHODS OF FORMING OPENINGS AND METHODS OF CONTROLLING THE DEGREE OF TAPER OF OPENINGS

[75] Inventors: Kevin G. Donohoe; Richard L. Stocks, both of Boise, Id.

[73] Assignee: Micron Technology, Inc., Boise, Id.

[21] Appl. No.: 09/031,090

[22] Filed: Feb. 26, 1998

[51] Int. Cl.$^7$ ................................................. H01L 21/302
[52] U.S. Cl. ........................... 438/723; 438/734; 438/743
[58] Field of Search .................................... 438/701, 713, 438/714, 734, 743, 723

[56] References Cited

U.S. PATENT DOCUMENTS

| | | | |
|---|---|---|---|
| 4,162,185 | 7/1979 | Coburn et al. | 438/743 |
| 4,671,849 | 6/1987 | Chen et al. | 438/713 |
| 4,814,041 | 3/1989 | Auda | 438/713 |
| 5,310,454 | 5/1994 | Ohiwa et al. | 438/743 |
| 5,420,077 | 5/1995 | Saito et al. | 438/701 |
| 5,746,884 | 5/1998 | Gupta et al. | 438/713 |
| 5,750,441 | 5/1998 | Figura et al. | 438/713 |

*Primary Examiner*—Benjamin L. Utech
*Assistant Examiner*—Duy-Vu Deo
*Attorney, Agent, or Firm*—Wells, St. John, Roberts, Gregory & Matkin, P.S.

[57] ABSTRACT

Methods of forming contact openings and methods of controlling the degree of taper of contact openings are described. In one implementation, a layer is first etched through a contact mask opening using a first set of etching conditions. The etching conditions provide a first degree of sidewall taper from vertical, if etching completely through the layer. After the first etching, the layer is second etched through the contact mask opening using a second set of etching conditions. The second set of etching conditions provide a second degree of sidewall taper from vertical, if etching completely through the layer. The second degree of sidewall taper is different from the first degree of taper. In another embodiment, a material through which a contact opening is to be etched to a selected depth is formed over a substrate. A masking layer having an opening therein is formed over the material. The material is first etched through the opening with the first etch having a first selectivity relative to the masking layer. After the first etch, and at a depth which is less than about 50% of the selected depth, the material is second etched, with the second etch having a second selectivity relative to the masking layer which is greater than the first selectivity. In a preferred implementation, the second degree of selectivity is achieved by modifying an etch parameter during the etching of the contact opening.

2 Claims, 4 Drawing Sheets

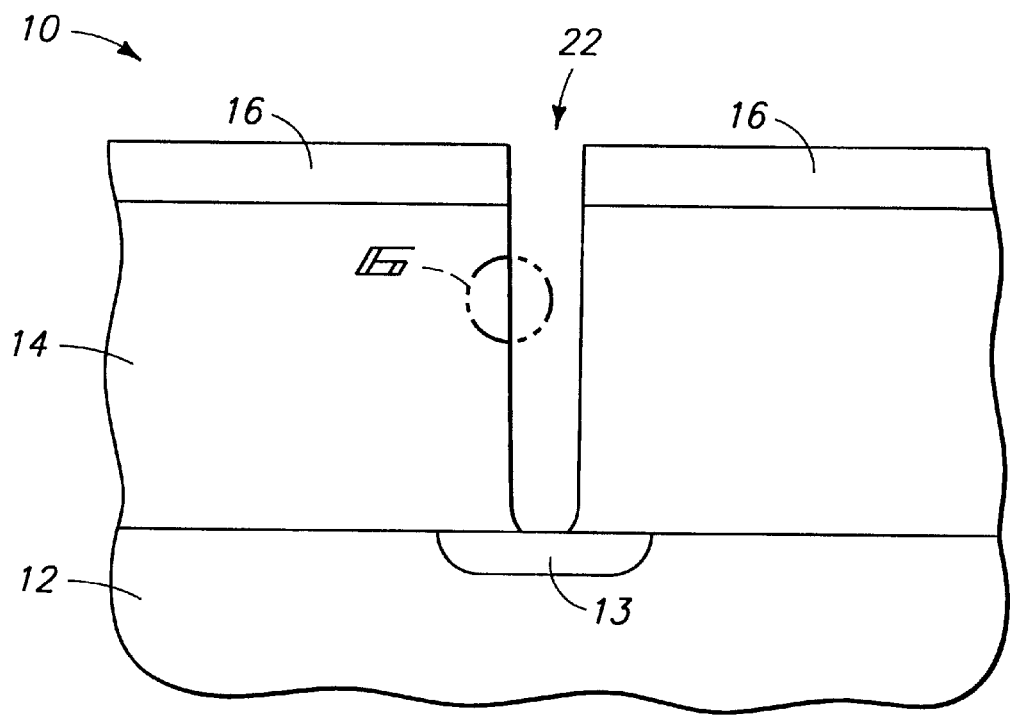
_Fig 5_
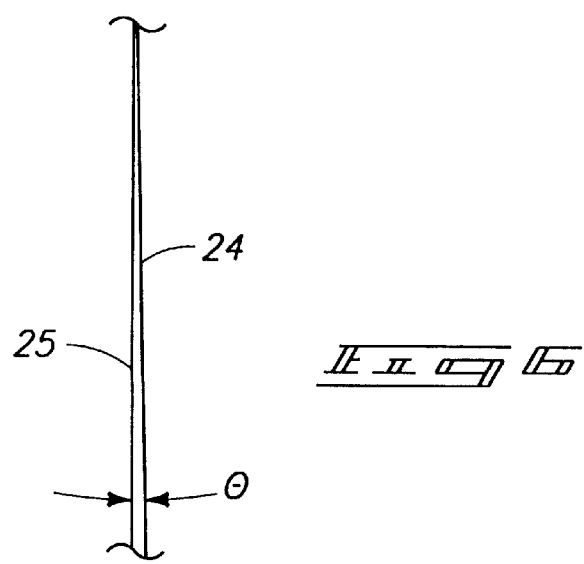
_Fig 6_

METHODS OF FORMING OPENINGS AND METHODS OF CONTROLLING THE DEGREE OF TAPER OF OPENINGS

TECHNICAL FIELD

This invention relates to methods of forming contact openings and to methods of controlling the degree of taper of contact openings.

BACKGROUND OF THE INVENTION

When integrated circuitry is formed, contact openings are often formed through insulative material for establishing electrical communication with the integrated circuitry. Such contact openings are typically subsequently filled with conductive material, such as a metal or polysilicon, whereby electrical communication is established with the integrated circuitry.

Contact openings are often formed to be fairly narrow; and, it is desirable from a design standpoint to form the contact openings to have sidewalls which are as near vertical as possible. This helps to ensure that the contact area at the bottom of the contact opening is sufficiently large to desirably cover and/or expose conductive material with which electrical communication is desired. As aspect ratios, i.e. the height-to-width ratio, of contact openings increase, it becomes increasingly important to ensure that the dimension of the bottom of the contact opening is sufficiently large to provide adequate coverage for conductive material which is subsequently formed therein. For narrow contact openings, such is accomplished by maintaining the sidewalls of the contact opening as near vertical as possible. Referring to FIGS. 1 and 2, two exemplary contact opening etch profiles are indicated generally at 100, 100a respectively. FIG. 1 shows a substrate 102 with a layer of insulative material 104 formed thereover. A masking layer 106 such as photoresist is formed over insulative material 104 and is subsequently patterned to define a contact opening pattern. Contact opening 108 is etched using an etch which is highly selective relative to masking layer 106. Hence, while a desirably high level of selectivity ensures that masking layer 106 remains over the substrate, the subsequent etch profile is unsatisfactorily tapered. FIG. 2 shows a substrate 100a in which like numbers from FIG. 1 have been utilized with the suffix "a". There, a contact opening 108a is etched through layer 104a using an etch with a comparatively lower degree of selectivity relative to an overlying masking layer (not shown). The lower degree of selectivity results in a contact opening profile with a more desirable degree of taper. Yet, the overlying masking layer can be completely removed, thereby undesirably opening up other substrate features to etching.

This invention arose out of concerns associated with providing methods of forming contact openings having sidewalls which are generally vertical within desired tolerances. This invention also arose out of concerns associated with providing methods for controlling the degree of taper of contact openings.

SUMMARY OF THE INVENTION

Methods of forming contact openings and methods of controlling the degree of taper of contact openings are described. In one implementation, a layer is first etched through a contact mask opening using a first set of etching conditions. The etching conditions provide a first degree of sidewall taper from vertical, if etching completely through the layer. After the first etching, the layer is second etched through the contact mask opening using a second set of etching conditions. The second set of etching conditions provide a second degree of sidewall taper from vertical, if etching completely through the layer. The second degree of sidewall taper is different from the first degree of taper. In another embodiment, a material through which a contact opening is to be etched to a selected depth is formed over a substrate. A masking layer having an opening therein is formed over the material. The material is first etched through the opening with the first etch having a first selectivity relative to the masking layer. After the first etch, and at a depth which is less than about 50% of the selected depth, the material is second etched, with the second etch having a second selectivity relative to the masking layer which is greater than the first selectivity. In a preferred implementation, the second degree of selectivity is achieved by modifying an etch parameter during the etching of the contact opening.

BRIEF DESCRIPTION OF THE DRAWINGS

Preferred embodiments of the invention are described below with reference to the following accompanying drawings.

FIG. 5 is a view of the FIG. 3 wafer fragment at a different processing step.

FIG. 6 is a view of a portion of a sidewall of a contact opening which is etched in accordance with one aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
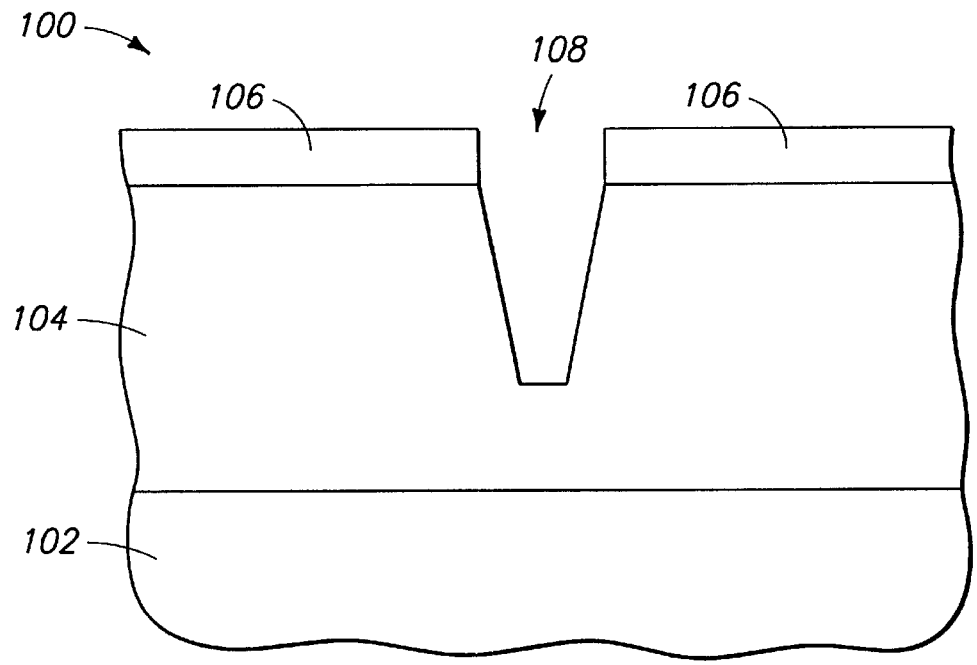
FIG. 1 is a diagrammatic side sectional view of a semiconductor wafer fragment having a contact opening thereover which has been etched utilizing an etch which is highly selective relative to an overlying masking layer.
Figure 2:
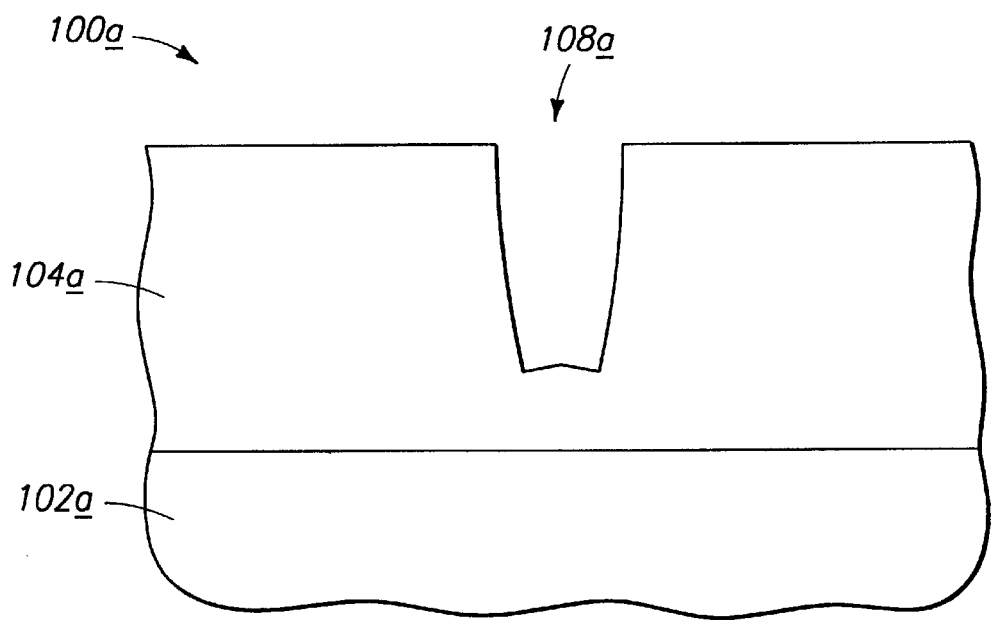
FIG. 2 is a view which is similar to the FIG. 1 view, only one which shows a contact opening which has been etched using an etch with a low degree of selectivity relative to a previously-formed masking layer.
Figure 3:
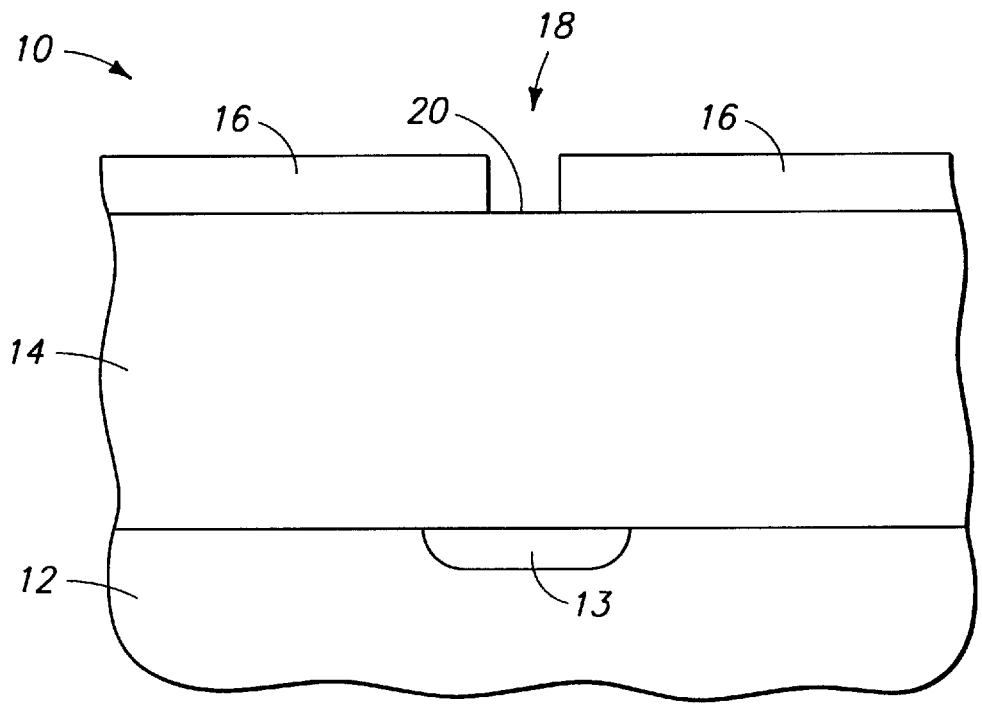
FIG. 3 is a diagrammatic side sectional view of a semiconductor wafer fragment in process in accordance with one aspect of the invention.

Referring to FIG. 3, a semiconductor wafer fragment in process is shown generally at 10 and comprises a semiconductive substrate 12. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

In this example, substrate 12 has a diffusion region 13 formed therein with which electrical communication is desired. A layer 14 of material is formed over substrate 12 and through which a contact opening having a selected depth is to be etched. An exemplary material for layer 14 is an oxide material such as borophosphosilicate glass (BPSG) formed to an example thickness of 2.2 micron. In a preferred embodiment, layer 14 comprises a single layer of BPSG. Other materials and numbers of layers can, of course, be used. A masking layer 16 is formed over layer 14 and subsequently patterned to define a contact mask opening 18 which exposes a surface portion 20 of layer 14. An exemplary material for masking layer 16 is photoresist.

Figure 4:
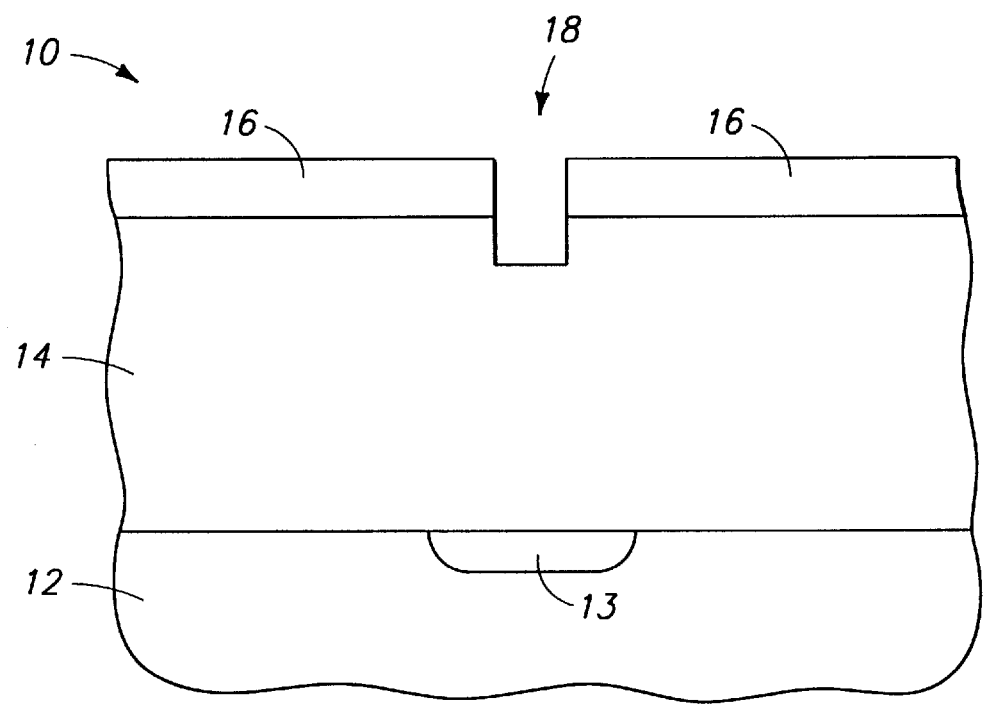
FIG. 4 is a view of the FIG. 3 wafer fragment at a different processing step.

Referring to FIG. 4, material of layer 14 is first etched through contact mask opening 18 using a first set of etching conditions or parameters which collectively provide a first degree of sidewall taper from vertical were etching to occur completely through the layer.

Referring to FIG. 5, and at an intermediate point proximate a first etch depth, layer 14 is second etched using a second set of etching conditions or parameters which provide a second degree of sidewall taper from vertical were etching to occur completely through the layer. The second etching continues to proximate the depth selected for contact opening 22. In the illustrated example, the selected depth is one which is sufficient to reach diffusion region 13. The second etching can, however, be terminated before reaching the ultimate depth to which the contact opening is to be etched. Preferably, the second degree of sidewall taper is different from the first degree of sidewall taper. Even more preferably, the first degree of sidewall taper is less than the second degree of sidewall taper.

Alternately considered, the first set of etching conditions are selected to provide a first degree of selectivity relative to masking layer 16. At an etch depth which is less than about 50% of the selected depth of the desired contact opening, the etching conditions or parameters are changed to provide the second etch with a second selectivity relative to masking layer 16 which is greater than the first selectivity. In the illustrated and preferred embodiment, the first and second etches of layer 14 are dry etches.

Referring to FIG. 6, a portion of a sidewall of contact opening 22 is indicated at 24. Such is displaced from a vertical line 25, or has a degree of taper from top-to-bottom away from vertical which defines an angle θ, wherein θ is preferably no greater than about 3°. Even more preferably, θ is around 1.5°.

Figure 7:
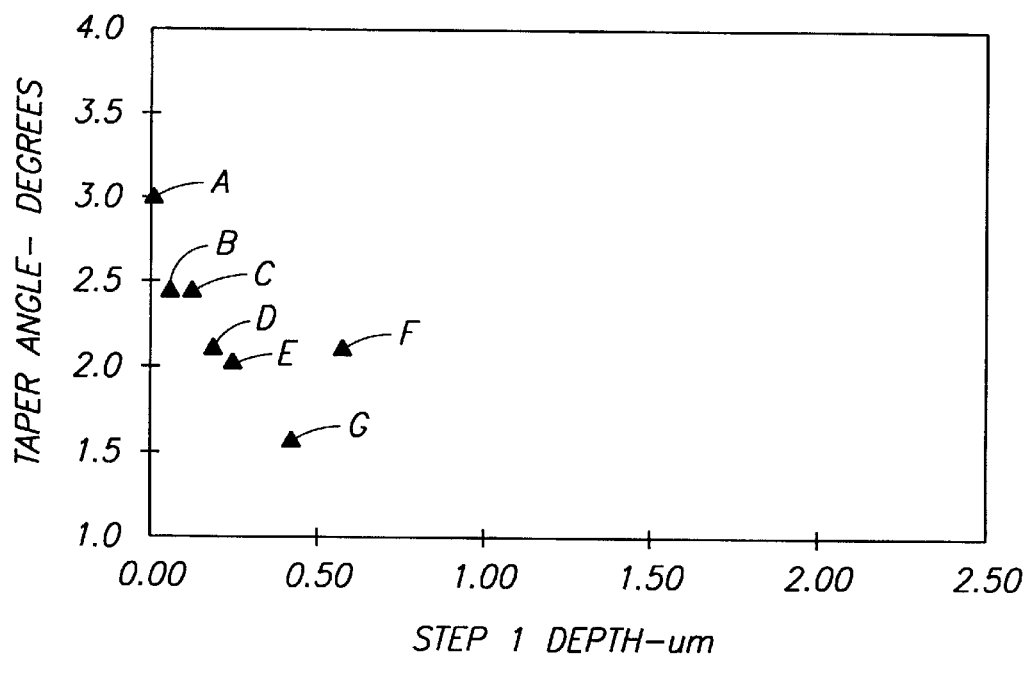
FIG. 7 is a graph which depicts taper angle versus step 1 etch depth.
Figure 8:
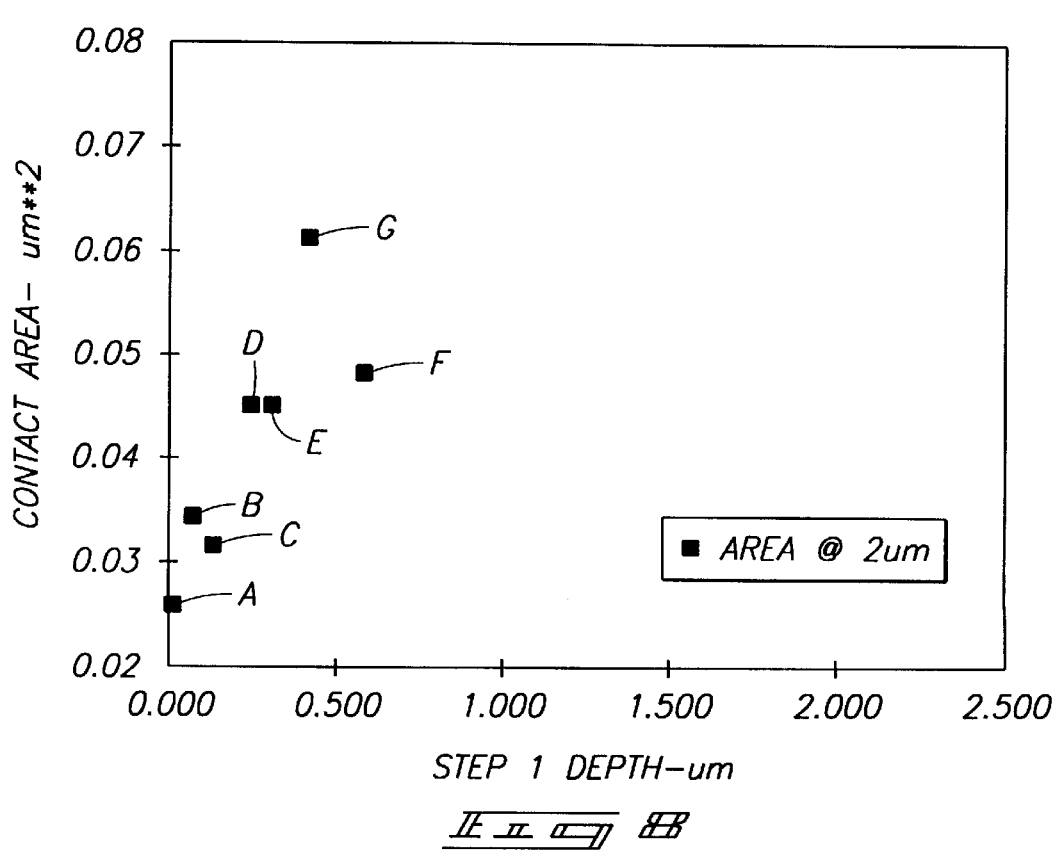
FIG. 8 is a graph which depicts contact area versus step 1 etch depth.

Referring to FIGS. 7 and 8, two graphs are set forth which describe data measured in a reduction to practice example. In such example, a LAM TCP 9100 high density oxide etcher was utilized to form contact openings as described above. BPSG was utilized as the layer through which the contact opening was etched, and the selected desired depth of the contact opening was around 2 microns. In conducting the first etch of the BPSG, the following etch conditions or parameters were utilized: 1050 Watts Source/1050 Watts Bias; 10 sccm $C_2HF_5$, 15 sccm $CHF_3$, 5 sccm $CH_2F_2$, at 15 mTorr. The first set of etch conditions comprise a first ratio of carbon to fluorine sufficient to provide a first degree of selectivity relative to the masking layer, e.g. the photoresist. The second etch was conducted with the following etch conditions or parameters: 700 Watts Source/700 Watts Bias; 20 sccm $C_2HF_5$, 10 sccm $CHF_3$, 10 sccm $CH_2F_2$ at 20 mTorr. The second set of etch conditions comprise a second ratio of carbon to fluorine to provide a second degree of selectivity relative to the masking layer which is different, and preferably greater than the first degree of selectivity. Preferably, the second ratio is lower than the first ratio.

Table 1 below describes data associated with the first and second etches. The first and second columns designated as "T1" and "T2" respectively, are the respective times, in seconds, of the first and second etches. The "Depth" column describes the depth, in microns, of the ultimately-etched contact opening, e.g. the selected depth. The "S1 Depth" column describes the depth, in microns, at which the first etch was modified to the second etch. The "Taper Angle" column describes the angle of taper of the sidewalls of the ultimately-etched contact opening away from vertical.

Referring to FIG. 7, contact opening taper angle is plotted in degrees away from vertical, as a function of the depth at which the first etch was changed to the second etch. A plurality of data points are shown at A, B, C, D, E, F, and G. Each data point corresponds to an individual row in Table 1. For example, data point G (last row in Table 1) describes a contact opening having a taper angle slightly larger than 1.5°. Such contact opening was formed, referring to Table 1, by conducting the first etch for 30 seconds, modifying the etch chemistry or parameters, and then conducting the second etch for 150 seconds. Such resulted in an intermediate switch point between etches of around 0.44 micron, for a resulting contact opening depth of around 2.6 micron.

TABLE 1

| | T1 | T2 | Depth | S1 Depth | Taper Angle |
|---|---|---|---|---|---|
| (A) | 1 | 150 | 2.3 | 0.015 | 3.005 |
| (B) | 5 | 145 | 2.2 | 0.073 | 2.434 |
| (C) | 10 | 140 | 2.3 | 0.147 | 2.434 |
| (D) | 15 | 135 | 2.3 | 0.220 | 2.148 |
| (E) | 20 | 130 | 2.3 | 0.293 | 2.005 |
| (F) | 40 | 110 | 2.2 | 0.587 | 2.148 |
| (G) | 30 | 150 | 2.6 | 0.440 | 1.575 |

Referring to FIG. 8, contact area at the bottom of the contact opening is plotted as a function of the depth at which the first etch was changed to the second etch for the same data points. Utilizing the same parameters or etch conditions as described above in connection with FIG. 7, the largest contact area observed appeared where the degree of taper away from vertical was the smallest, i.e. data point G. Such is desirable, as mentioned above, from the standpoint of opening up as much potential conductive contact area within desired tolerances.

Accordingly, methods of the present invention enable a degree of contact opening taper to be controlled and selected. Such methods also provide for contact openings having generally vertical sidewalls which increase the contact area at the bottom of the contact opening.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A method of forming an opening through a layer of material comprising:

provideing a layer of a material;

first etching into the material through a mask opening using a first set of etching conditions which are defined by a first degree of sidewall taper from vertical, the first etching forming an opening in the material;

after the first etching, second etching into the material through the mask opening using a second set of etching conditions which are defined by a second degree of sidewall taper from vertical, the second degree of sidewall taper being different from the first degree of taper; the second etching extending the opening downwardly into the material; and wherein the first degree of sidewall taper is less than the second degree of sidewall taper.

2. A method of forming an opening in a layer of material comprising:

providing a layer of a material;

first etching into the material through a mask opening using a first set of etching conditions which are defined by a first degree of sidewall taper from vertical, the first etching forming an opening in the material;

after the first etching, second etching into the material through the mask opening using a second set of etching conditions which are defined by a second degree of sidewall taper from vertical, the second degree of sidewall taper being different from the first degree of taper; the second etching extending the opening downwardly into the material;

the first degree of sidewall taper is less than the second degree of sidewall taper; and the first and second etchings have different degrees of selectivity relative to material from which the mask is formed.

* * * * *